(12) United States Patent
Chia

(10) Patent No.: US 7,358,821 B2
(45) Date of Patent: Apr. 15, 2008

(54) DIGITAL FREQUENCY JITTERING APPARATUS WITH RANDOM DATA GENERATOR AND METHOD THEREOF

(75) Inventor: Ju-Lin Chia, Hsin-Chu (TW)

(73) Assignee: Leadtrend Technology Corp., Science-Based Industrial Park, Hsin-Chu (TW)

( * ) Notice: Subject to any disclaimer, the term of this patent is extended or adjusted under 35 U.S.C. 154(b) by 107 days.

(21) Appl. No.: 11/456,849

(22) Filed: Jul. 11, 2006

(65) Prior Publication Data
US 2008/0024235 A1    Jan. 31, 2008

(51) Int. Cl.
H03B 29/00    (2006.01)
(52) U.S. Cl. ........................................................ 331/78
(58) Field of Classification Search .................. 331/78; 380/46; 708/250
See application file for complete search history.

(56) References Cited
U.S. PATENT DOCUMENTS
6,229,366 B1    5/2001    Balakrishnan et al.
6,249,876 B1    6/2001    Balakrishnan et al.
7,243,117 B2 *  7/2007    Yamamoto et al. ......... 708/250

* cited by examiner

Primary Examiner—David Mis
(74) Attorney, Agent, or Firm—Winston Hsu

(57) ABSTRACT

A digital frequency jittering circuit for varying a switching frequency of a power supply is disclosed. The digital frequency jittering circuit includes a random data generator, an analog to digital functional module, and a digital to analog functional module. The random data generator has an oscillator for generating an oscillating signal having the switching frequency; a delay module for delaying the oscillating signal by first and second delay amounts to generate first and second delayed signals, wherein the first delay amount is not equal to the second delay amount; and a phase error detecting module for detecting an phase error between the first and the second delayed signals to generate a random data. The analog to digital functional module converts the random data into a digital random value. The digital to analog functional module varies the switching frequency of the oscillating signal according to the digital random value.

16 Claims, 5 Drawing Sheets

DIGITAL FREQUENCY JITTERING APPARATUS WITH RANDOM DATA GENERATOR AND METHOD THEREOF

BACKGROUND OF THE INVENTION

1. Field of the Invention

The present invention relates to a random data generator, and more particularly, to a digital frequency jittering circuit that utilizes the random data generator for varying a switching frequency of a power supply, and a related method thereof.

2. Description of the Prior Art

A primary problem that plagues a conventional switching power supply is the electromagnetic interference (EMI) effect. It is well known that the EMI generated by the switching power supply can cause problems for communications devices in the vicinity of the power supply. Additionally, the high frequency signal of EMI will be coupled to a component of the AC mains signal that will be provided to other devices. Furthermore, the radiated EMI by the power supply can interfere with wireless radio and wireless television transmissions that are carried by other entities. It is well known that to reduce the negative effects of the electromagnetic interference (EMI) of a switching power supply one can scatter the power of a predetermined frequency by utilizing a prior art frequency jittering means. The effect of the scattered power depends upon the range that the predetermined frequency to be scattered within an operating frequency range. For instance, a wider irregular range of the predetermined frequency to be scattered within the operating frequency range results in a smaller EMI being generated in the switching power supply. In other words, when the power is distributed over the wider frequency range, the EMI effect is alleviated. Therefore, generating the irregular scattered range of the predetermined frequency within the operating frequency range is a critical factor in lowering the effect of the EMI of the switching power supply.

Please refer to FIG. 1. FIG. 1 illustrates a prior art frequency jittering generator 10. The frequency jittering generator 10 utilizes a state transition logic circuit 12 to generate a pseudo random value. Thepseudo random value is then transmitted to an output logic circuit 14 to generate an output signal, and the output signal is then sampled by a sampling unit 16 that is controlled by a clock signal. An output logic circuit 14 will generate a group of binary output signals for being converting into an oscillating signal with a frequency that corresponds to the group of binary output signals by utilizing a digital to frequency converter 18. Because state transition logic circuit 12 is derived from a predetermined rational equation, and the predetermined rational equation will generate a sequential output as the random value, the oscillating signal that is obtained from the sampled binary output signal is a regulated sequential jittering signal in a long term. Accordingly, the frequency jittering generator 10 does not effectively overcome the EMI effect of the switching power supply.

It is apparent that new and improves methods and devices are needed to solve the above-mentioned problems.

SUMMARY OF THE INVENTION

An objective of the present invention is therefore to provide a digital frequency jittering circuit that utilizes a random data generator for varying a switching frequency of a power supply, and a related method thereof.

According to an embodiment of the present invention, a random data generator is disclosed. The random data generator includes an oscillator, a delay module, and a phase error detecting module. The oscillator is for generating an oscillating signal. The delay module, coupled to the oscillator, is for delaying the oscillating signal by a first delay amount to generate a first delayed signal and delaying the oscillating signal by a second delay amount to generate a second delayed signal, wherein the first delay amount is not equal to the second delay amount. The phase error detecting module, coupled to the delay module, is for detecting an phase error between the first and the second delayed signals to generate a random data.

According to an embodiment of the present invention, a digital frequency jittering circuit is disclosed. The digital frequency jittering circuit includes a random data generator for varying a switching frequency of a power supply. The digital frequency jittering circuit includes a random data generator, an analog to digital functional module, and a digital to analog functional module. The random data generator includes an oscillator. The oscillator generates an oscillating signal having the switching frequency. A delay module, coupled to the oscillator, is for delaying the oscillating signal by a first delay amount to generate a first delayed signal and delaying the oscillating signal by a second delay amount to generate a second delayed signal, wherein the first delay amount is not equal to the second delay amount. A phase error detecting module, coupled to the delay module, is for detecting an phase error between the first and the second delayed signals to generate a random data. The analog to digital functional module, coupled to the random data generator, is for converting the random data into a digital random value. The digital to analog functional module, coupled to the oscillator and the analog to digital functional module, is for varying the switching frequency of the oscillating signal according to the digital random value.

According to an embodiment of the present invention, a random data generating method is disclosed. The method includes generating an oscillating signal; delaying the oscillating signal by a first delay amount to generate a first delayed signal and delaying the oscillating signal by a second delay amount to generate a second delayed signal, wherein the first delay amount is not equal to the second delay amount; and detecting an phase error between the first and the second delayed signals to generate a random data.

According to an embodiment of the present invention, a method for varying a switching frequency of a power supply is disclosed. The method includes generating an oscillating signal; delaying the oscillating signal by a first delay amount to generate a first delayed signal and delaying the oscillating signal by a second delay amount to generate a second delayed signal, wherein the first delay amount is not equal to the second delay amount; detecting an phase error between the first and the second delayed signals to generate a random data; converting the random data into a digital random value; and varying the switching frequency of the oscillating signal according to the digital random value.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, consumer electronic equipment manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 2:
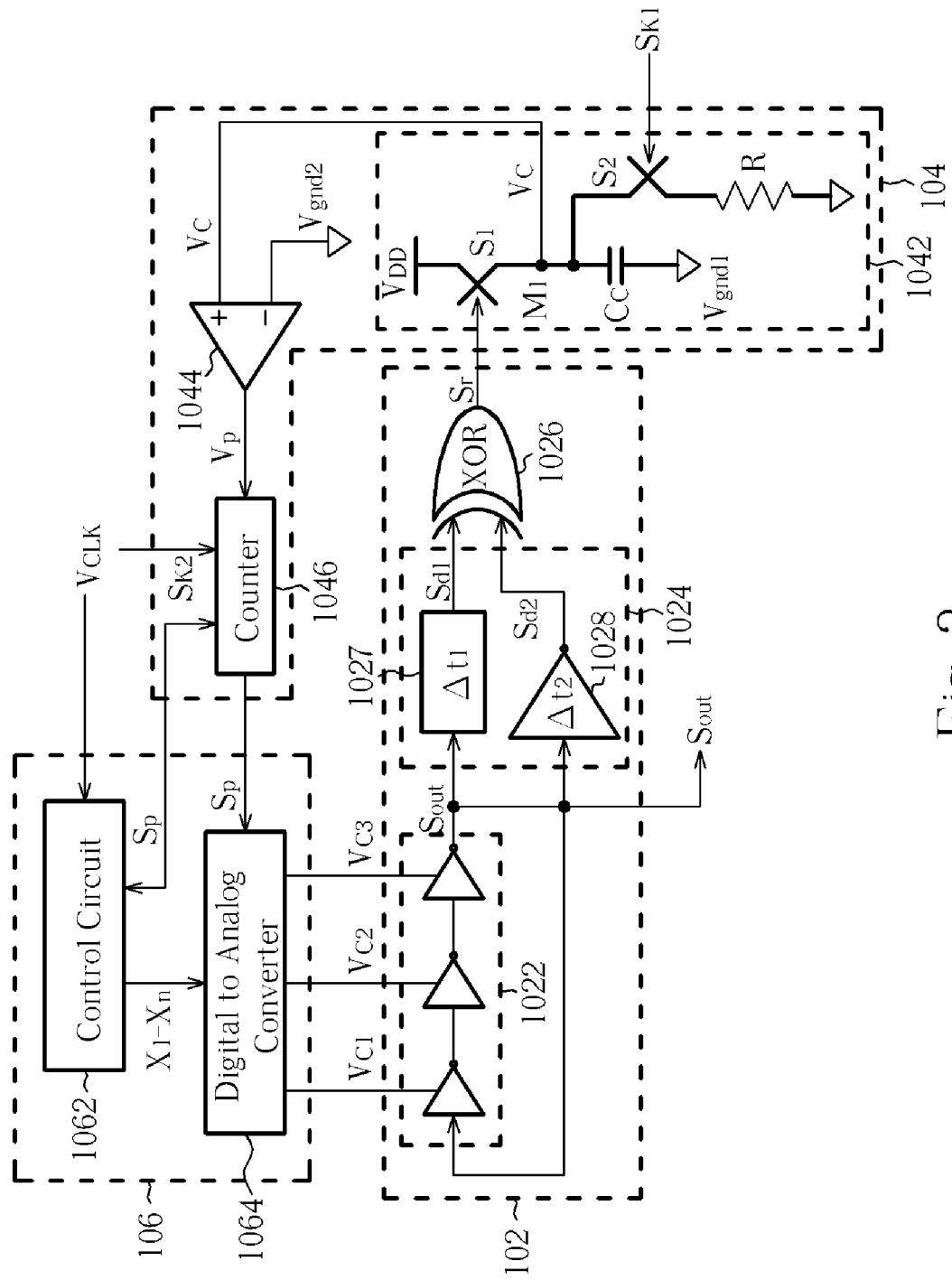
FIG. 2 is a diagram illustrating a digital frequency jittering circuit for varying a switching frequency with random generator of a power supply according to an embodiment of the present invention.

Please refer to FIG. 2. FIG. 2 illustrates a diagram of a digital frequency jittering circuit 100 for varying a switching frequency $f_{osc}$ of a power supply (i.e., a switching power) according to an embodiment of the present invention. The digital frequency jittering circuit 100 comprises a random data generator 102, an analog to digital functional module 104, and a digital to analog functional module 106. In which random data generator 102 comprises an oscillator 1022 for generating an oscillating signal $S_{out}$ having the switching frequency $f_{osc}$; a delay module 1024, coupled to oscillator 1022, for delaying oscillating signal $S_{out}$ by a first delay amount $\Delta t_1$ to generate a first delayed signal $S_{d1}$ and delaying oscillating signal $S_{out}$ by a second delay amount $\Delta t_2$ to generate a second delayed signal $S_{d2}$, wherein the first delay amount $\Delta t_1$ is not equal to the second delay amount $\Delta t_1$; and a phase error detecting module 1026, coupled to delay module 1024, for detecting an phase error $\Delta\phi$ between the first and the second delayed signals $S_{d1}$, $S_{d2}$ to generate a random data $S_r$. Furthermore, analog to digital functional module 104, coupled to random data generator 102, is for converting random data $S_r$ into a digital random value $S_p$. Digital to analog functional module 106, coupled to oscillator 1022 and analog to digital functional module 104, is for varying switching frequency $f_{osc}$ of oscillating signal $S_{out}$ according to digital random value $S_p$.

In random data generator 102, oscillator 1022 is implemented by a ring oscillator. Please note that, the oscillator can be any type of controllable oscillating circuit. The delay module 1024 comprises a first delay circuit 1027 (e.g., a delay chain) for delaying the oscillating signal $S_{out}$ with the first delay amount $\Delta t_1$ equal to 540 degrees, and a second delay circuit 1028 (e.g., an inverter) delays oscillating signal $S_{out}$ with the second delay amount $\Delta t_2$ equal to 180 degrees. Please note that, the first delay amount $\Delta t_1$ is not limited to 540 and can be any degree that capable to extract the jitter between two consequential clocks of the oscillating signal $S_{out}$, such as 180+360*N, wherein N=0, 1, 2 . . . . The phase error detecting module 1026 comprises an exclusive OR (XOR) gate to perform an XOR operation upon the first and the second delayed signals $S_{d1}$, $S_{d2}$ to generate the random data $S_r$. It should be noted that the present invention is not limited to the above disclosed configuration. For example, the delay module 1024 can adopt other circuit components to provide different delay amounts. These and other examples all fall within the scope of the present invention.

The analog to digital functional module 104 comprises a phase-error power accumulator 1042, which is for accumulating the power of the random data to generate an output voltage $V_c$; in which phase-error power accumulator 1042 comprises a capacitor $C_c$, a resistor R, a first switch $S_1$ and a second switch $S_2$. The first switch $S_1$ is coupled to a first predetermined voltage $V_{dd}$ and capacitor $C_c$, for selectively allowing the first predetermined voltage $V_{dd}$ to charge capacitor $C_c$ according to random data $S_r$; while the second switch $S_2$ is coupled to capacitor $C_c$ and a second first predetermined voltage $V_{gnd1}$, for selectively allowing capacitor $C_c$ to discharge through the second predetermined voltage $V_{gnd1}$ according to a first reset signal $S_{k1}$. The analog to digital functional module 104 also comprises a comparator 1044 coupled to phase-error power accumulator 1042 and a reference voltage $V_{gnd2}$, for comparing output voltage $V_c$ with reference voltage $V_{gnd2}$ and generating a latch signal $V_p$ when output voltage $V_c$ exceeds reference voltage $V_{gnd2}$; and a counter 1046, coupled to comparator 1044, for calculating a counter value N and outputting counter value N as digital random value $S_p$ to digital to analog functional module 106 when receiving latch signal $V_p$, where when the digital to analog functional module 106 completes varying switching frequency $f_{osc}$ of oscillating signal $S_{out}$ utilizing digital random value $S_p$, digital to analog functional module 106 outputs a second reset signal $S_{k2}$ to counter 1046 to reset counter value N to an initial value $N_{min}$.

The digital to analog functional module 106 comprises a control circuit 1062, coupled to counter 1046, for sequentially outputting a plurality of control values $X_1$-$X_n$ according to digital random value $S_p$; and a digital to analog converter 1064, coupled to control circuit 1062 and oscillator 1022, for converting the control values $X_1$-$X_n$ into a plurality of control voltages ($V_{c1}$-$V_{c3}$) respectively to control the oscillator 1022 to vary switching frequency $f_{osc}$ of oscillating signal $S_{out}$.

Figure 3:
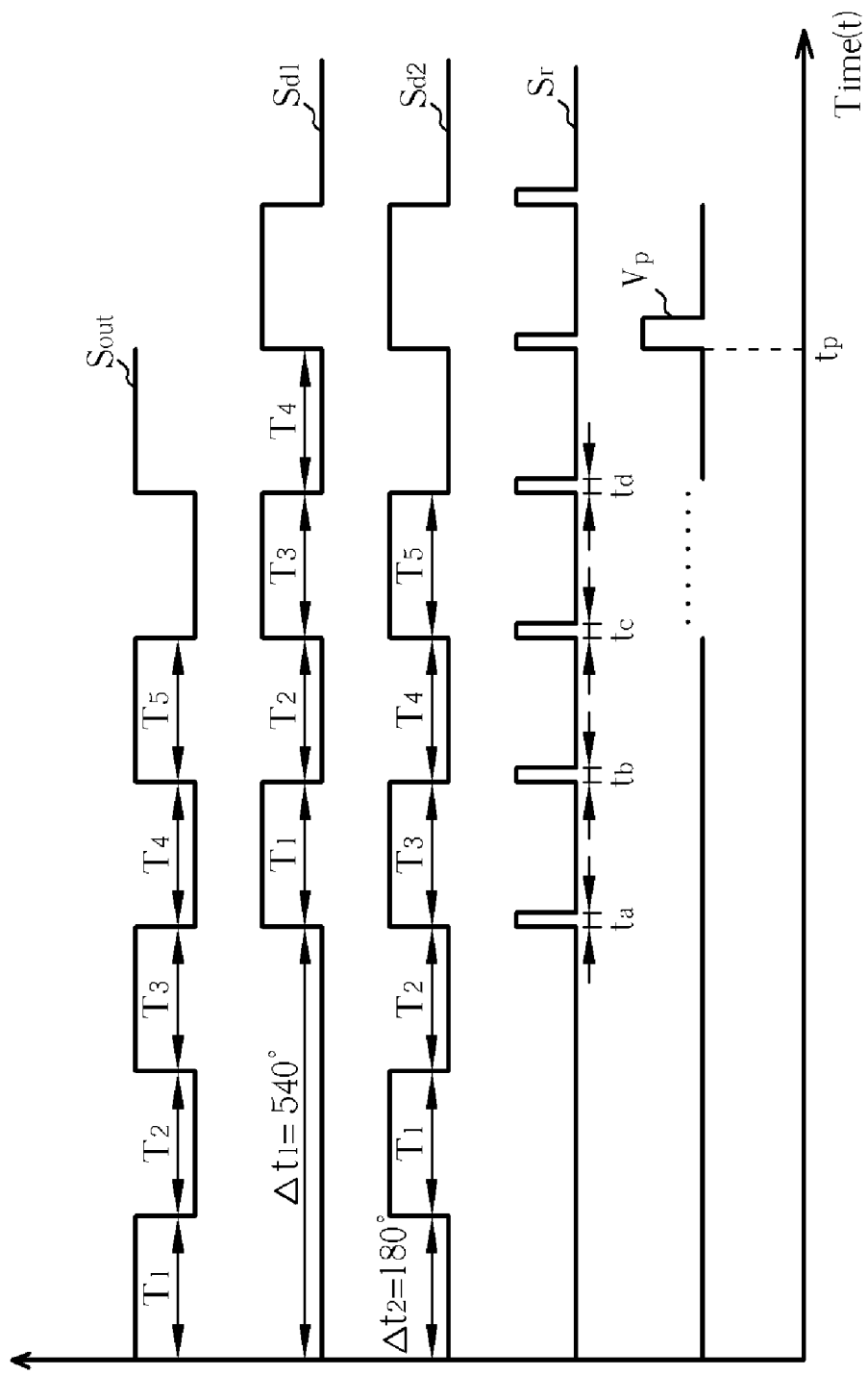
FIG. 3 is a timing diagram of the oscillating signal, the first delayed signal, the second delayed signal, and the random data shown in FIG. 2.

According to the embodiment of the present invention, for simplicity, the control voltages ($V_{c1}$-$V_{c3}$) of oscillator 1022 are fixed at the beginning, thus, ideally, switching frequency $f_{osc}$ (i.e., period T) of oscillating signal $S_{out}$ is also fixed. However, periods $T_1$, $T_2$, $T_3$, . . . of switching frequency $f_{osc}$ of oscillating signal $S_{out}$ are slightly different because of the inherently jitter within oscillating signal $S_{out}$. Please refer to FIG. 3. FIG. 3 illustrates a timing diagram of the oscillating signal $S_{out}$, the first delayed signal $S_{d1}$, the second delayed signal $S_{d2}$, and random data $S_r$. Therefore, after oscillating signal $S_{out}$ passes through the first delay circuit 1027 and the second delay circuit 1028 with delay amounts $\Delta t_1$=3T(540 degrees) and $\Delta t_2$=T(180 degrees) respectively, the jittering within oscillating signal $S_{out}$ will generate a slight overlap at time $t_a$, $t_b$, $t_c$, $t_d$ of the first delayed signal $S_{d1}$ and the second delayed signal $S_{d2}$. Accordingly, when the first delayed signal $S_{d1}$ and the second delayed signal $S_{d2}$ are inputted to the phase error detecting module 1026 (exclusive OR (XOR) gate), random data $S_r$ (pulses) will be generated at the time $t_a$, $t_b$, $t_c$, $t_d$ as shown in FIG. 3. Furthermore, each pulse width of the pulses of random data $S_r$ is dependent on the phase error at time $t_a$, $t_b$, $t_c$, $t_d$, that is, $\Delta\Phi_a$, $\Delta\Phi_b$, $\Delta\Phi_c$ and $\Delta\Phi_d$.

Then, the pulses of random data $S_r$ will turn on the first switch $S_1$ to charge capacitor $C_c$ at the time intervals of each pulse width. Thus, the larger the time intervals of the pulse width, the longer the charging time to the capacitor $C_c$. Please note that, because the jitter within oscillating signal $S_{out}$ is an unpredictable effect, therefore the pulse width of each pulse of random data $S_r$ can be regarded as a random value that will consequently cause the charged energy (output voltage $V_c$) at a first node $M_1$ of capacitor $C_c$ to be random. Anyway, the charged energy at a first node $M_2$ of capacitor $C_c$ is accumulated according to random data $S_r$ until output voltage $V_c$ exceeds reference voltage $V_{gnd2}$. Then, comparator 1044 generates latch signal $V_p$, for example, at $t_p$ in this embodiment to counter 1046. It should be noted that, latch signal $V_p$ is also a random signal. Furthermore, according to the embodiment of the present invention, counter 1046 is designed to keep in a counting state before output voltage $V_c$ exceeds reference voltage $V_{gnd2}$; whenever counter 1046 receives latch signal $V_p$, counter 1046 will stop counting and latch the counter value N, and output the counter value N to control circuit 1062 of digital to analog functional module 106. Then, control circuit 1062 outputs the respective control values $X_1$-$X_n$ to digital to analog functional module 106 to convert digital random value $S_p$ into control voltages $V_{c1}$-$V_{c3}$. Please note that, whenever a latch signal $V_p$ is generated, second switch $S_2$ discharges the first node $M_1$ of capacitor $C_c$ to the second predetermined voltage $V_{gnd1}$ according to the first reset signal $S_{k1}$.

Figure 4:
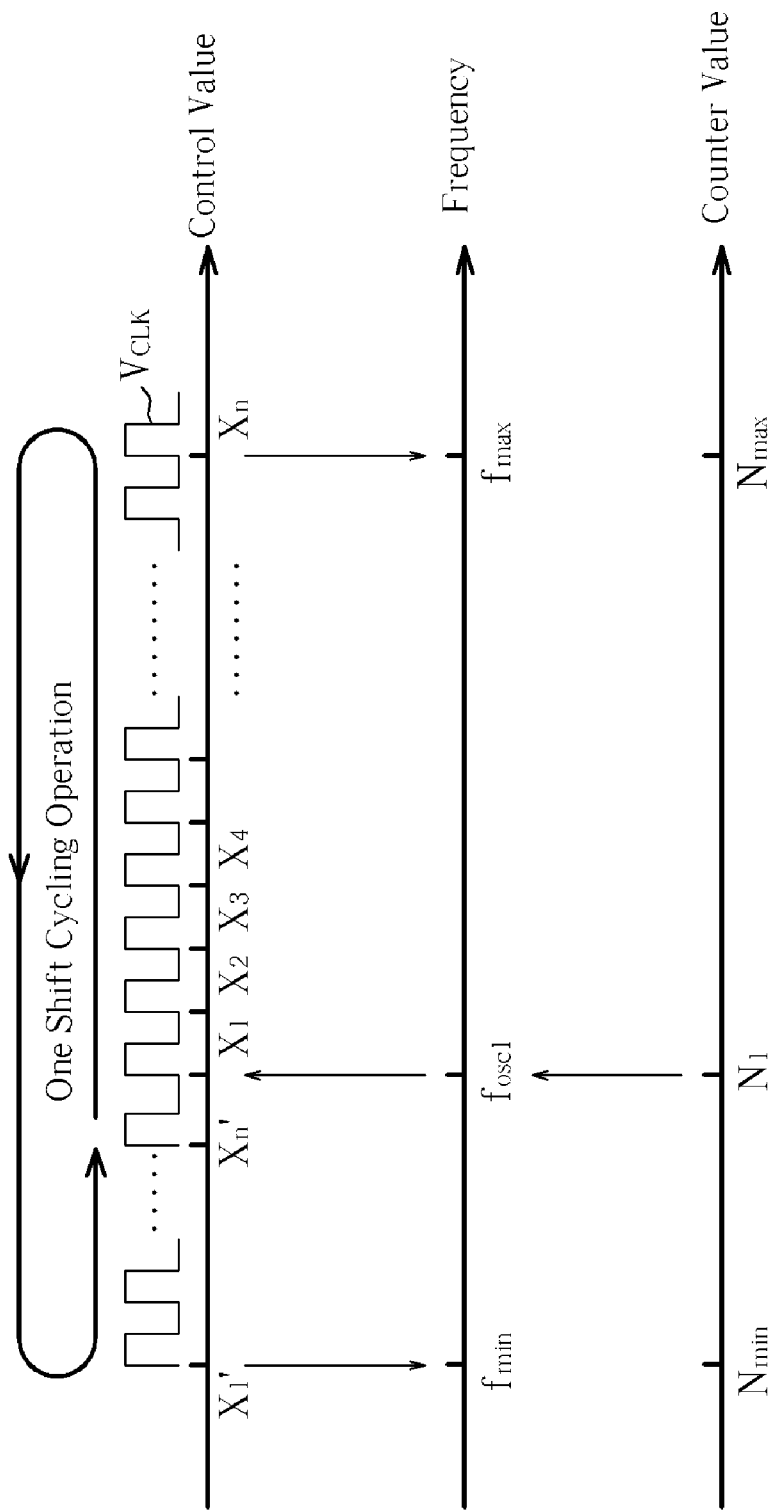
FIG. 4 is a frequency domain diagram illustrating the shift cycling operating of the digital frequency jittering circuit of FIG. 2.

Please refer to FIG. 2 again, a control clock $V_{CLK}$ is further coupled to control circuit 1062 and counter 1046 for controlling a shift cycling operating of digital frequency jittering circuit 100. Please refer to FIG. 4. FIG. 4 illustrates a frequency domain of the shift cycling operating of digital frequency jittering circuit 100 of FIG. 2. In FIG. 4, the initial switching frequency $f_{osc}$ of oscillating signal $S_{out}$ is restricted in a fixed frequency boundary ($f_{min}$ to $f_{max}$), in which the minimum frequency $f_{min}$ and the maximum frequency $f_{max}$ correspond to the minimum counter value $N_{min}$ and the maximum counter value $N_{max}$ of counter 1046, respectively. Therefore, when latch signal $V_p$ latches counter 1046 at a counter value between $N_{min}$ and $N_{max}$, for the example, at counter value of $N_1$, then counter value $N_1$ will be sent to control circuit 1062 and digital random value $S_p$ corresponding to counter value $N_1$ will be sent to digital to analog converter 1064. Accordingly, digital random value $S_p$ changes the initial oscillating condition (control voltages $V_{c1}$-$V_{c3}$) of oscillator 1022 that will shift switching frequency $f_{osc}$ of oscillating signal $S_{out}$ into an initial oscillating frequency $f_{osc1}$. Meanwhile, control circuit 1062 sequentially outputs a plurality of increasing control values $X_1$-$X_n$ to digital to analog converter 1064 according to control clock $V_{CLK}$, in which control value $X_1$ is corresponding to counter value $N_1$, and $X_1$ is corresponding to counter value $N_{max}$. When control value reach the maximum control value $X_n$, control circuit 1062 will shift the control value back to $X_1'$, which is corresponding to counter value $N_{min}$ as shown in FIG. 4. Again, control circuit 1062 sequentially outputs a plurality of increasing control values $X_1'$-$X_n'$ to digital to analog converter 1064 according to control clock $V_{CLK}$ and $X_n'$ is the control value $X_1$-1 as shown in FIG. 4. Accordingly, $X_1$ to $X_n$ and $X_1'$ to $X_n'$ represent sequential values that will result in the shift cycling operating of digital frequency jittering circuit 100 as shown in FIG. 4. Furthermore, digital to analog functional module 106 converts each control value ($X_1$ to $X_n$ and $X_1'$ to $X_n'$) into control voltages $V_{c1}$-$V_{c3}$. In other word, each control value ($X_1$ to $X_n$ and $X_1'$ to $X_n'$) will induce control voltages $V_{c1}$-$V_{c3}$ inputted to the ring oscillator (i.e., the oscillator 1022 shown in FIG. 2) that will increase switching frequency $f_{osc}$ of oscillating signal $S_{out}$ from $f_{osc1}$ to $f_{max}$ and $f_{min}$ to $f_{osc1}'$, respectively, as shown in FIG. 4. According to the present invention, after control circuit 1062 outputs the last control value $X_n'$ to digital to analog converter 1064 (switching frequency $f_{osc}$ of oscillating signal $S_{out}$ is $f_{osc1}'$), control circuit 1062 will control digital to analog functional module 106 to sustain at the last control value $X_n'$, and output the second reset signal $S_{k2}$ to counter 1046 to reset counter value $N_1$ to the initial value $N_{min}$. The switching frequency $f_{osc}$ of oscillating signal $S_{out}$ will also sustain at $f_{osc1}'$. Then, shift cycling operating of digital frequency jittering circuit 100 can be restarted. Therefore, according to the embodiment of the present invention, the initial switching frequency $f_{osc1}$ of oscillating signal $S_{out}$ are randomly distributed between $f_{min}$ and $f_{max}$, and For a long time, the switching frequency $f_{osc}$ of oscillating signal $S_{out}$ will randomly distributed between $f_{min}$ and $f_{max}$. Therefore, the present invention is able to enhance EMI (i.e., electromagnetic interference) protection of switching power. Please note that, control circuit 1062 of the present invention is not limited sequentially outputs a plurality of increasing control values to digital to analog converter 1064, but also can be designed as sequentially outputs a plurality of decreasing control values to digital to analog converter 1064 that according to the requirement of designer.

Figure 1:
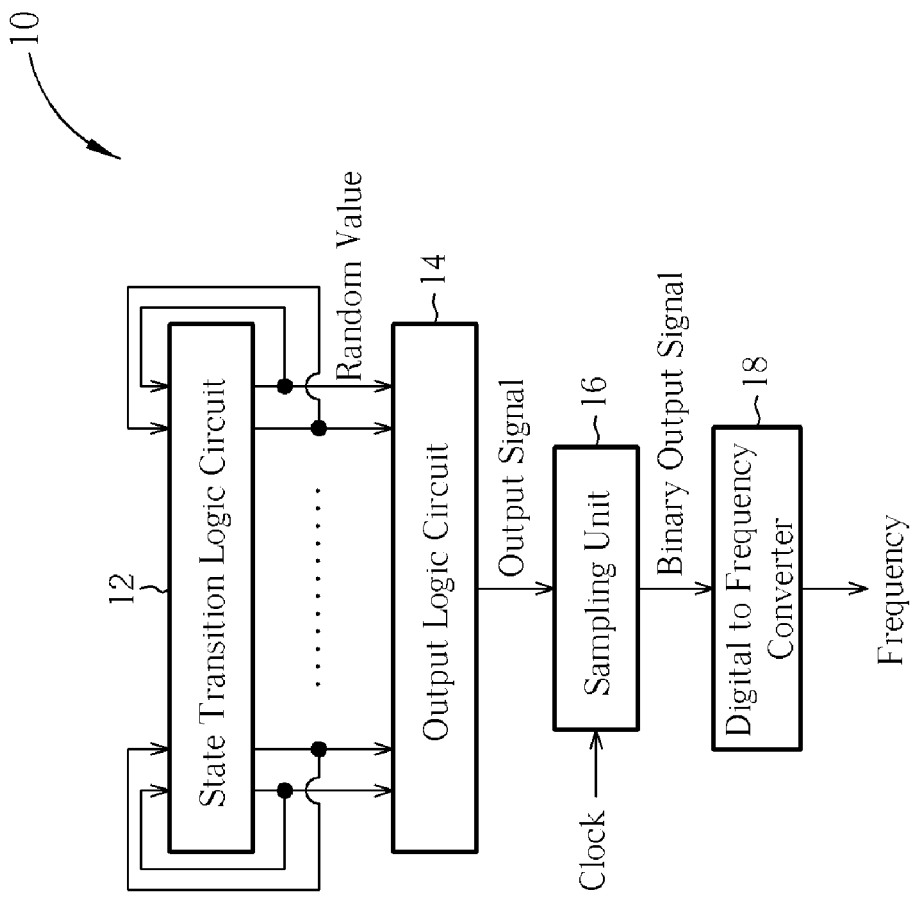
FIG. 1 is a diagram illustrating a prior art frequency jittering generator.
Figure 5:
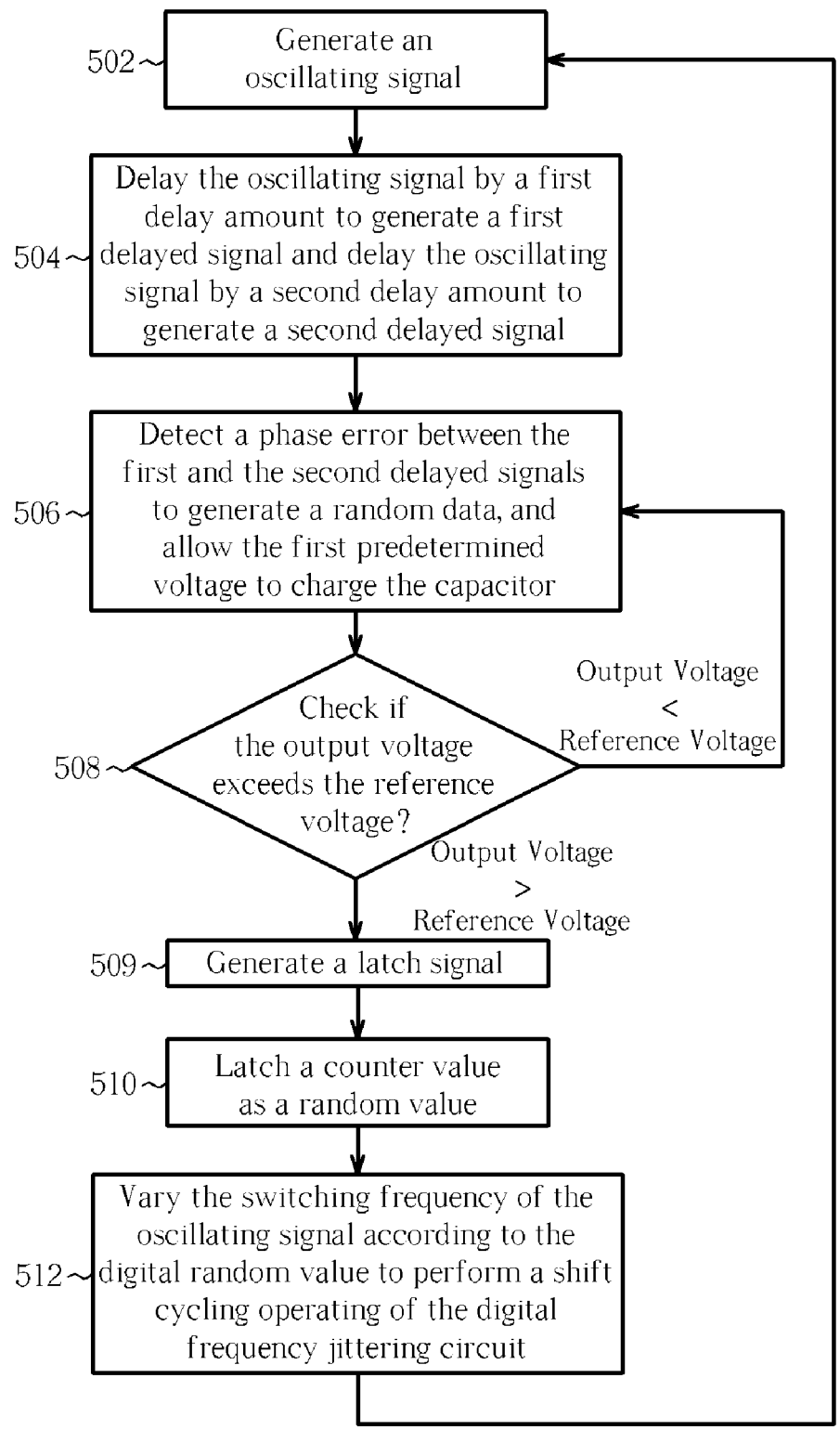
FIG. 5 is a flow chart illustrating a method for varying a switching frequency of a power supply according to the digital frequency jittering circuit shown in FIG. 1.

Please refer to FIG. 5. FIG. 5 illustrates a method for varying a switching frequency of a power supply according to digital frequency jittering circuit 100 in FIG. 1. The method comprises the steps as shown below:

Step 502: Generate an oscillating signal $S_{out}$ having the switching frequency $f_{osc}$;

Step 504: Delay oscillating signal $S_{out}$ by a first delay amount $\Delta t_1$ to generate a first delayed signal $S_{d1}$ and delay oscillating signal $S_{out}$ by a second delay amount $\Delta t_2$ to generate a second delayed signal $S_{d2}$, wherein the first delay amount $\Delta t_1$ is not equal to the second delay amount $\Delta t_2$;

Step 506: Detect a phase error $\Delta\phi$ between the first and the second delayed signals $S_{d1}$, $S_{d2}$ to generate a random data $S_r$, and allow the first predetermined voltage $V_{dd}$ to charge capacitor $C_c$ according to random data $S_r$;

Step 508: Check if the output voltage $V_c$ exceeds reference voltage $V_{gnd2}$. When output voltage $V_c$ exceeds reference voltage $V_{gnd2}$, go to step 510; otherwise, go to step 506;

Step 509: Generate a latch signal $V_p$;

Step 510: Latch counter value N as random value $S_p$; and

Step 512: Vary switching frequency $f_{osc}$ of oscillating signal $S_{out}$ according to digital random value $S_p$, and after a shift cycling operating of digital frequency jittering circuit 100, go to step 502.

In step 504, delay amounts $\Delta t_1$=3T (540 degrees) and $\Delta t_2$=T (180 degrees), in which T is period of oscillating signal $S_{out}$. In step 512, the method sequentially outputs a plurality of increasing control values $X_1$-$X_n$ and then $X_1'$ to $X_n'$ to vary switching frequency $f_{osc}$ of oscillating signal $S_{out}$ that will complete a shift cycling operating of digital frequency jittering circuit 100.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A random data generator, comprising:
   an oscillator, for generating an oscillating signal;
   a delay module having a first delay circuit and a second delay circuit, coupled to the oscillator, for using the first delay circuit to delay the oscillating signal by a first delay amount equal to 180+360*N degrees to generate a first delayed signal, and using the second delay circuit to delay the oscillating signal by a second delay amount equal to 180 degrees to generate a second delayed signal, wherein N is nonnegative integer; and
   a phase error detecting module, coupled to the delay module, for detecting an phase error between the first and the second delayed signals to generate a random data.

2. The random data generator of claim 1, wherein the second delay circuit is an inverter.

3. The random data generator of claim 1, wherein the phase error detecting module comprises an exclusive OR (XOR) gate to perform an XOR operation upon the first and the second delayed signals to generate the random data.

4. The random data generator of claim 1, wherein the oscillator is a ring oscillator.

5. A digital frequency jittering circuit for varying a switching frequency of a power supply, comprising:
   a random data generator, comprising:
      an oscillator, for generating an oscillating signal having the switching frequency;
      a delay module, coupled to the oscillator, for delaying the oscillating signal by a first delay amount to generate a first delayed signal and delaying the oscillating signal by a second delay amount to generate a second delayed signal, wherein the first delay amount is not equal to the second delay amount; and
      a phase error detecting module, coupled to the delay module, for detecting an phase error between the first and the second delayed signals to generate a random data;
   an analog to digital functional module, coupled to the random data generator, for converting the random data into a digital random value; and
   a digital to analog functional module, coupled to the oscillator and the analog to digital functional module, for varying the switching frequency of the oscillating signal according to the digital random value.

6. The digital frequency jittering circuit of claim 5, wherein the delay module comprises:
   a first delay circuit, for delaying the oscillating signal with the first delay amount equal to 540 degrees; and
   a second delay circuit, for delaying the oscillating signal with the second delay amount equal to 180 degrees.

7. The digital frequency jittering circuit of claim 5, wherein the phase error detecting module comprises an exclusive OR (XOR) gate to perform an XOR operation upon the first and the second delayed signals to generate the random data.

8. The digital frequency jittering circuit of claim 5, wherein the oscillator is a ring oscillator.

9. The digital frequency jittering circuit of claim 5, wherein the analog to digital functional module comprises:
   a phase-error power accumulator, for accumulating the power of the random data to generate an output voltage;
   a comparator, coupled to the phase-error power accumulator and a reference voltage, for comparing the output voltage with the reference voltage and generating a latch signal when the output voltage exceeds the reference voltage; and
   a counter, coupled to the comparator, for calculating a counter value and outputting the counter value as the digital random value to the digital to analog functional module when receiving the latch signal, where when the digital to analog functional module completes varying the switching frequency of the oscillating signal utilizing the digital random value, the digital to analog functional module outputs a reset signal to the counter to reset the counter value to an initial value.

10. The digital frequency jittering circuit of claim 9, wherein the phase-error power accumulator comprises:
    a capacitor;
    a resistor;
    a first switch, coupled to a first predetermined voltage and the capacitor, for selectively allowing the first predetermined voltage to charge the capacitor according to the random data; and
    a second switch, coupled to the capacitor and a second first predetermined voltage, for selectively allowing the capacitor to discharge through the second predetermined voltage according to the reset signal.

11. The digital frequency jittering circuit of claim 5, wherein the digital to analog functional module comprises:
    a control circuit, coupled to the counter, for sequentially outputting a plurality of control values according to the digital random value; and
    a digital to analog converter, coupled to the control circuit and the oscillator, for converting the control values into a plurality of control voltages respectively to control the oscillator to vary the switching frequency of the oscillating signal.

12. A random data generating method, comprising:
    (a) generating an oscillating signal;
    (b) delaying the oscillating signal by a first delay amount equal to 180+360*N degrees to generate a first delayed signal and delaying the oscillating signal by a second delay amount equal to 180 degrees to generate a second delayed signal, wherein N is nonnegative integer; and
    (c) detecting an phase error between the first and the second delayed signals to generate a random data.

13. A method for varying a switching frequency of a power supply, comprising:
    (a) generating an oscillating signal;
    (b) delaying the oscillating signal by a first delay amount to generate a first delayed signal and delaying the oscillating signal by a second delay amount to generate a second delayed signal, wherein the first delay amount is not equal to the second delay amount;
    (c) detecting an phase error between the first and the second delayed signals to generate a random data;
    (d) converting the random data into a digital random value; and
    (e) varying the switching frequency of the oscillating signal according to the digital random value.

14. The method of claim 13, wherein step (b) comprises:
    delaying the oscillating signal with the first delay amount equal to 180+360*N degrees, wherein N is nonnegative integer; and
    delaying the oscillating signal with the second delay amount equal to 180 degrees.

15. The method of claim 13, wherein step (d) comprises:
    (f) accumulating the power of the random data to generate an output voltage;

(g) comparing the output voltage with a reference voltage and generating a latch signal when the output voltage exceeds the reference voltage; and (h) calculating a counter value and outputting the counter value as the digital random value, where when completes varying the switching frequency of the oscillating signal utilizing the digital random value, outputting a reset signal to reset the counter value to an initial value.

16. The method of claim 13, wherein step (e) comprises:

sequentially outputting a plurality of control values according to the digital random value; and converting the control values into a plurality of control voltages respectively to control the switching frequency of the oscillating signal.

* * * * *